US012356797B2

(12) United States Patent
Park et al.

(10) Patent No.: US 12,356,797 B2
(45) Date of Patent: Jul. 8, 2025

(54) THIN FILM TRANSISTOR ARRAY SUBSTRATE

(71) Applicant: LG Display Co., Ltd., Seoul (KR)

(72) Inventors: TaeHan Park, Paju-si (KR); Saehoon Oh, Paju-si (KR); AhnKi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 485 days.

(21) Appl. No.: 18/070,997

(22) Filed: Nov. 29, 2022

(65) Prior Publication Data

US 2023/0217697 A1 Jul. 6, 2023

(30) Foreign Application Priority Data

Dec. 30, 2021 (KR) .................. 10-2021-0193020

(51) Int. Cl.
*H10K 50/86* (2023.01)
*H10D 30/67* (2025.01)
*H10D 86/40* (2025.01)
*H10D 86/60* (2025.01)
*H10K 59/121* (2023.01)
*H10K 59/126* (2023.01)

(52) U.S. Cl.
CPC .......... *H10K 50/86* (2023.02); *H10K 59/126* (2023.02)

(58) Field of Classification Search
CPC .. H10D 30/6723; H10D 86/441; H10D 86/60; H10K 59/126; H10K 59/1213
See application file for complete search history.

(56) References Cited

U.S. PATENT DOCUMENTS

| 2020/0265789 | A1* | 8/2020 | Park | H10K 59/1213 |
| 2021/0066421 | A1* | 3/2021 | Son | H10K 59/8791 |
| 2021/0098737 | A1* | 4/2021 | Pang | H10K 59/8722 |
| 2022/0165981 | A1* | 5/2022 | Hopkin | H10K 50/11 |
| 2022/0199755 | A1* | 6/2022 | Ko | H10K 59/1315 |
| 2022/0208883 | A1* | 6/2022 | Kim | H10K 59/123 |
| 2022/0208887 | A1* | 6/2022 | Yoon | H10K 59/122 |
| 2022/0208913 | A1* | 6/2022 | Lee | H10K 50/844 |
| 2022/0208916 | A1* | 6/2022 | Kim | H10K 59/80515 |
| 2022/0209171 | A1* | 6/2022 | Lee | H10K 59/122 |

FOREIGN PATENT DOCUMENTS

KR    10-2016-0002337 A    1/2016

* cited by examiner

Primary Examiner — Mohsen Ahmadi
(74) Attorney, Agent, or Firm — Fenwick & West LLP

(57) ABSTRACT

A thin film transistor array substrate comprises a substrate, a light shielding layer provided on the substrate, and a thin film transistor provided overlapped by the light shielding layer, wherein the thin film transistor includes a semiconductor layer on the light shielding layer, a gate insulating layer on the semiconductor layer, a gate electrode on the gate insulating layer, and a source electrode connected to a first side of the semiconductor layer and a drain electrode connected to a second side of the semiconductor layer, wherein at least one of the light shielding layer, the gate electrode, the source electrode, and the drain electrode includes a first quantum-dot layer.

20 Claims, 7 Drawing Sheets

External light

THIN FILM TRANSISTOR ARRAY SUBSTRATE

CROSS-REFERENCE TO RELATED APPLICATION

This application claims the benefit of the Republic of Korea Patent Application No. 10-2021-0193020 filed on Dec. 30, 2021, which is hereby incorporated by reference as if fully set forth herein.

BACKGROUND

Field of Technology

The present disclosure relates to a thin film transistor array substrate.

Discussion of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, and an electroluminescence display (ELD) apparatus have been used. The electroluminescence display (ELD) apparatus may include an organic light emitting display (OLED) apparatus and a quantum-dot light emitting display (QLED) apparatus.

Among the display apparatuses, the electroluminescence display apparatus is a self-light emitting type and has advantages in that a viewing angle and a contrast ratio are more excellent than those of the liquid crystal display (LCD) apparatus. Also, since the electroluminescence display apparatus does not require a separate backlight, it is advantageous that the electroluminescence display apparatus is able to be thin and lightweight and has low power consumption. Further, the electroluminescence display apparatus has advantages in that it may be driven at a direct current low voltage, has a fast response speed, and especially has a low manufacturing cost.

SUMMARY

The inventors have recognized that a polarizing plate is conventionally formed below a substrate, but a structure in which a polarizing plate is removed to reduce a thickness of the display apparatus is disclosed in a bottom emission type display apparatus. In this case, since most of external light reflected by metal lines constituting a thin film transistor is emitted, reflectance of the display apparatus is increased. Thus, visibility of a panel is reduced.

The present disclosure has been formed in view of the above problems and it is an object of the present disclosure to provide a thin film transistor array substrate that may attenuate reflectance due to external light and improve a color of emitted light.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor array substrate comprising: a substrate; a light shielding layer on the substrate, a thin film transistor on the substrate, the thin film transistor overlapped by the light shielding layer, the thin film transistor including: a semiconductor layer on the light shielding layer; a gate insulating layer on the semiconductor layer; a gate electrode on the gate insulating layer; a source electrode connected to a first side of the semiconductor layer; and a drain electrode connected to a second side of the semiconductor layer that is opposite the first side, wherein at least one of the light shielding layer, the gate electrode, the source electrode and the drain electrode includes a first quantum-dot layer, and visible light incident on the first quantum-dot layer is converted to non-visible light by the first quantum-dot layer.

In one embodiment, a thin film transistor array substrate comprises: a substrate; a thin film transistor on the substrate; and a light shielding layer that overlaps the thin film substrate such that the light shielding layer is between the thin film transistor and the substrate, wherein at least one of the light shielding layer and a portion of the thin film transistor incudes a first quantum-dot layer configured to convert a portion of incident light in a visible spectrum to reflected light of a non-visible spectrum.

In one embodiment, thin film transistor array substrate comprises: a substrate; a thin film transistor on the substrate; and a light shielding layer that overlaps the thin film substrate such that the light shielding layer is between the thin film transistor and the substrate, wherein at least one of the light shielding layer and a portion of the thin film transistor incudes a first quantum-dot layer configured to convert a portion of incident light in a visible spectrum to reflected light of a predetermined color in the visible spectrum.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
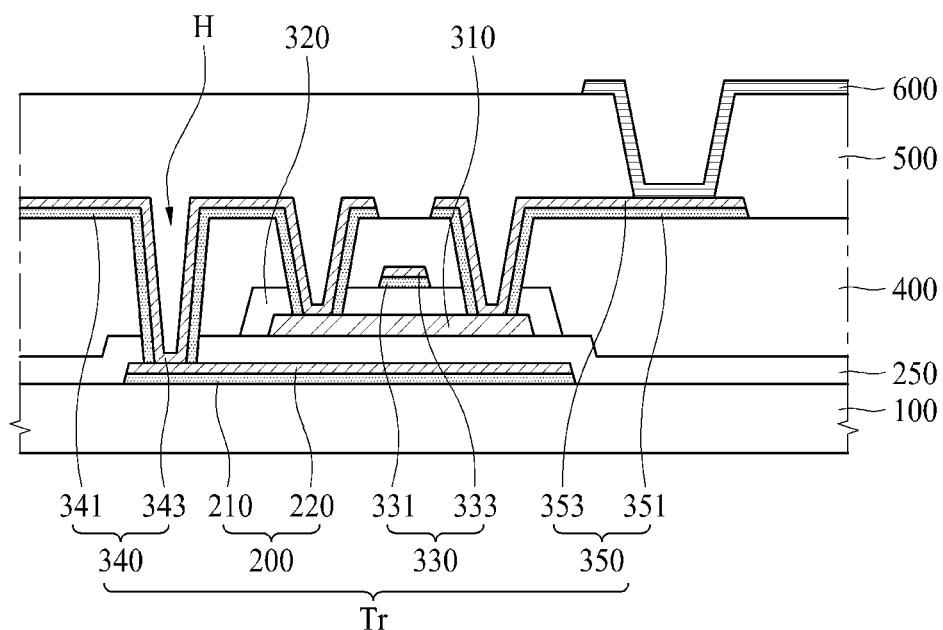
FIG. 1 is a cross-sectional view illustrating a thin film transistor array substrate according to a first embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, an embodiment of the present disclosure will be described with reference to the drawings.

First Embodiment

FIG. 1 is a cross-sectional view illustrating a thin film transistor array substrate according to a first embodiment of the present disclosure.

Referring to FIG. 1, the thin film transistor array substrate according to the first embodiment of the present disclosure may include a substrate 100, a light shielding layer 200, a buffer layer 250, a driving thin film transistor Tr, and a pixel electrode 600.

The substrate 100 may include glass or plastic, but is not limited thereto. The substrate 100 may include a semiconductor material such as a silicon wafer.

The light shielding layer 200 may be formed on the substrate 100. In one embodiment, the light shielding layer 200 includes a first quantum-dot layer 210 and a metal layer 220 on the first quantum-dot layer 210.

The first quantum-dot layer 210 may be provided on the substrate 100, and may include a plurality of quantum-dots. In one embodiment, a quantum-dot is a nano-material and a size and distribution of the quantum-dots may be adjusted to be used as an optical converter. In the first embodiment of the present disclosure, the first quantum-dot layer 210 may convert light incident from the outside that is in a visible spectrum into light of an infrared spectrum that is a non-visible spectrum. In detail, the first quantum-dot layer 210 is capable of absorbing light having a wavelength range of 10 nm to 380 nm and light having a wavelength of 380 nm to 780 nm from the light incident from the outside. For example, the first quantum-dot layer 210 may absorb light of an ultraviolet spectrum, which has a wavelength range of 10 nm to 380 nm, and light of a visible light spectrum, which has a wavelength range of 380 nm to 780 nm, from externally incident light. The first quantum-dot layer 210 may emit light having a wavelength range of 780 nm to 1000 nm. For example, the first quantum-dot layer 210 may emit light of an infrared spectrum, which has a wavelength range of 780 nm to 1000 nm in response to incident light in the visible spectrum. Therefore, the light of the wavelength range in the visible spectrum, which affects reflectance of the display apparatus, may be absorbed to attenuate reflectance of the display apparatus, whereby visibility of a panel may be improved.

The metal layer 220 may be provided on the first quantum-dot layer 210, and may include a conductive material capable of shielding light. The metal layer 220 may be a single layer or multi-layer including a metal material such as aluminum (Al), silver (Ag), titanium (Ti), copper (Cu), molybdenum (Mo), tungsten (W) or chromium (Cr), or their alloy. For example, when the metal layer 220 is a double layer that includes an upper layer and a lower layer, the upper layer may include a metal material such as aluminum (Al), silver (Ag), titanium (Ti), copper (Cu), molybdenum (Mo), tungsten (W) or chromium (Cr), and the lower layer may include a molybdenum-titanium (MoTi) alloy, a molybdenum-titanium oxide (MoTiOx), a tungsten oxide (WOx) or a molybdenum-copper oxide (MoCuOx).

The buffer layer 250 is provided on the light shielding layer 200. The buffer layer 250 may include a single layer of silicon nitride (SiNx) or silicon oxide (SiOx), or a multi-layer of silicon nitride (SiNx) and silicon oxide (SiOx). The buffer layer 250 may insulate the light shielding layer 200, and may improve adhesion between layers formed on the buffer layer 250 and the substrate 100.

The driving thin film transistor Tr may be provided on the buffer layer 250, and may be disposed at a position overlapped with the light shielding layer 200. The driving thin film transistor Tr may include a semiconductor layer 310, a gate insulating layer 320, a gate electrode 330, a source electrode 340, and a drain electrode 350.

The semiconductor layer 310 of the driving thin film transistor Tr is provided on the buffer layer 250. The semiconductor layer 310 may thus for example be over the light shielding layer with the buffer layer 250 in between. Alternatively, the buffer layer 250 may be seen as a part of the light shielding layer, such that the semiconductor layer is (directly) on the light shielding layer (which in that case corresponds to both 200 and 250). The semiconductor layer 310 may include a metal oxide such as polysilicon or indium-zinc-oxide (IZO), indium-gallium-tin-oxide (IGTO) and indium-gallium-oxide (IGO).

The gate insulating layer 320 of the driving thin film transistor Tr may be provided on the semiconductor layer 310 to insulate the gate electrode 330 from the semiconductor layer 310. The gate insulating layer 320 of the driving thin film transistor Tr may include a single layer of silicon nitride (SiNx) or silicon oxide (SiOx), or a multi-layer of silicon nitride (SiNx) and silicon oxide (SiOx).

The gate electrode 330 of the driving thin film transistor Tr may be provided on the gate insulating layer 320, and may include a first quantum-dot layer 331 and a metal layer 333 on the first quantum-dot layer 331. The gate electrode 330 may be formed on the gate insulating layer 320 to overlap a channel area of the semiconductor layer 310.

The first quantum-dot layer 331 may be provided on the gate insulating layer 320, and may include a plurality of quantum-dots. As described above, the first quantum-dot layer 331 may convert light incident from the outside that is in the visible spectrum into light of an infrared spectrum that is non-visible. Therefore, the light of the wavelength range in the visible spectrum, which affects reflectance of the display apparatus, may be absorbed to attenuate reflectance of the display apparatus, whereby visibility of the panel may be improved.

The metal layer 333 of the gate electrode 330 may be provided on the first quantum-dot layer 331, and may include a conductive material capable of shielding light. For example, the metal layer 333 may be a single layer or multi-layer including a metal material such as aluminum (Al), silver (Ag), copper (Cu), titanium (Ti), molybdenum (Mo), tungsten (W) or chromium (Cr), or their alloy. For example, when the metal layer 333 is a double layer that includes an upper layer and a lower layer, the upper layer may include a metal material such as aluminum (Al), silver (Ag), titanium (Ti), copper (Cu), molybdenum (Mo), tungsten (W) or chromium (Cr), and the lower layer may include a molybdenum-titanium (MoTi) alloy, a molybdenum-titanium oxide (MoTiOx), a tungsten oxide (WOx) or a molybdenum-copper oxide (MoCuOx).

An interlayer insulating layer 400 is provided on the gate insulating layer 320 and the gate electrode 330 of the thin film transistor Tr. The interlayer insulating layer 400 may include a single layer of silicon nitride (SiNx) or silicon oxide (SiOx), or a multi-layer of silicon nitride (SiNx) and silicon oxide (SiOx).

A contact hole for exposing the semiconductor layer 310 of the driving thin film transistor Tr may be formed in the gate insulating layer 320 and the interlayer insulating layer 400 of the driving thin film transistor Tr.

The source electrode 340 and the drain electrode 350 of the driving thin film transistor Tr are provided on the interlayer insulating layer 400 while facing each other. Also, each of the source electrode 340 and the drain electrode 350 of the driving thin film transistor Tr may be connected to the semiconductor layer 310 through the contact hole formed in the gate insulating layer 320 and the interlayer insulating layer 400.

In one embodiment, the source electrode 340 includes a first quantum-dot layer 341 and a metal layer 343 on the first quantum-dot layer 341. Similarly, the drain electrode 350 includes a first quantum-dot layer 351 and a metal layer 353 on the first quantum-dot layer 351.

The first quantum-dot layers 341 and 351 of the source electrode 340 and the drain electrode 350 are provided on the interlayer insulating layer 400 while facing each other. As described above, the first quantum-dot layers 341 and 351 may convert light incident from the outside that is in the visible spectrum into light of an infrared spectrum that is non-visible. Therefore, the light of the wavelength range, which affects reflectance of the display apparatus, may be absorbed to attenuate reflectance of the display apparatus, whereby visibility of the panel may be improved.

Each of the metal layers 343 and 353 of the source electrode 340 and the drain electrode 350 may be provided on the respective one of the first quantum-dot layers 341 and 351, and may include a conductive material capable of shielding light. For example, each of the metal layers 343 and 353 may be a single layer or multi-layer including a metal material such as aluminum (Al), silver (Ag), titanium (Ti), copper (Cu), molybdenum (Mo), tungsten (W) or chromium (Cr), or their alloy. For example, when the metal layers 343 and 353 are double layers that include an upper layer and a lower layer, the upper layer may include a metal material such as aluminum (Al), silver (Ag), titanium (Ti), copper (Cu), molybdenum (Mo), tungsten (W) or chromium (Cr), and the lower layer may include a molybdenum-titanium (MoTi) alloy, a molybdenum-titanium oxide (MoTiOx), a tungsten oxide (WOx) or a molybdenum-copper oxide (MoCuOx).

Each of the metal layers 343 and 353 of the source electrode 340 and the drain electrode 350 may be connected to the semiconductor layer 310 through a contact hole formed in the gate insulating layer 320, the first quantum-dot layers 341 and 351 and the interlayer insulating layer 400.

In order to expose the metal layer 220 of the light shielding layer 200, a contact hole H passing through the buffer layer 250, the first quantum-dot layer 341 of the source electrode 340 and the interlayer insulating layer 400 may be formed. The metal layer 343 of the source electrode 340 may be extended in a direction in which the contact hole H is formed, and may be electrically connected to the metal layer 220 of the light shielding layer 200 through the contact hole H. A lower surface of the contact hole H exposes a portion of the metal layer 220 of the light shielding layer 200, and an inner surface of the contact hole H is comprised of the first quantum-dot layer 341 of the source electrode 340.

Therefore, the metal layer 220 of the light shielding layer 200 may be connected with the portion of the metal layer 343 of the source electrode 340 that is on the portion of the first quantum-dot layer 341 that forms the inner surface of the contact hole, so that the metal layer 220 of the light shielding layer 200, which includes the conductive material, may be electrically stabilized, whereby the metal layer 220 of the light shielding layer 200 may be prevented from disturbing a normal operation of the semiconductor layer 310. Although the light shielding layer 200 is connected to the source electrode 340, the light shielding layer 200 may be connected to the drain electrode 350 in the same manner.

A bank 500 is provided on the interlayer insulating layer 400. The bank 500 may compensate for a step difference due to the driving thin film transistor Tr and the contact holes. The bank 500 may include an inorganic insulating material or an organic insulating material. Alternatively, the bank 500 may be formed by stacking a layer including an organic insulating material and a layer including an inorganic insulating material.

A pixel electrode 600 may be provided on the bank 500, and may be connected to the drain electrode 350 through a contact hole formed in the bank 500.

In the first embodiment of the present disclosure, the light shielding layer 200, the gate electrode 330, the source electrode 340 and the drain electrode 350 respectively include first quantum-dot layers 210, 331, 341 and 351 and metal layers 220, 333, 343 and 353, respectively. Therefore, the light incident from the outside which is in a spectrum of visible light to humans may be converted into the light of the infrared spectrum which is not visible to humans. Thus, reflectance of external light that is in the visible range of humans may be attenuated to improve visibility of the panel.

In the first embodiment of the present disclosure, the light shielding layer 200, the gate electrode 330, the source electrode 340 and the drain electrode 350 include the first quantum-dot layers 210, 331, 341 and 351 and the metal layers 220, 333, 343 and 353, respectively, but are not limited thereto. At least one of the light shielding layer 200, the gate electrode 330, the source electrode 340 or the drain electrode 350 may include the first quantum-dot layers 210, 331, 341 and 351 and the metal layers 220, 333, 343 and 353. For example, the light shielding layer 200, the source electrode 340 and the drain electrode 350 may respectively include the first quantum-dot layers 210, 341 and 351 and the metal layers 220, 343 and 353, and the gate electrode 330 may include the metal layer 333 without a quantum-dot layer. Alternatively, the light shielding layer 200 may include the first quantum-dot layer 210 and the metal layer 220, and the gate electrode 330, the source electrode 340 and the drain electrode 350 may respectively include the metal layers 333, 343 and 353 without their respective quantum-dot layers.

Second Embodiment

Figure 2:
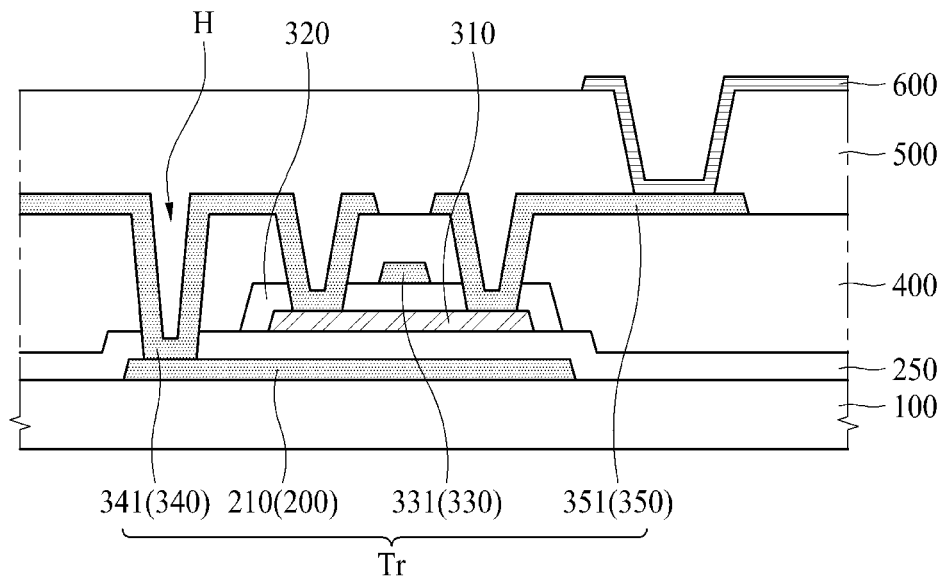
FIG. 2 is a cross-sectional view illustrating a thin film transistor array substrate according to a second embodiment of the present disclosure.

FIG. 2 is a cross-sectional view illustrating a thin film transistor array substrate according to a second embodiment of the present disclosure.

The thin film transistor array substrate according to FIG. 2 is modified from the thin film transistor array substrate of FIG. 1 in the light shielding layer 200, the gate electrode 330, the source electrode 340 and the drain electrode 350. Hereinafter, the following description will be based on differences from the thin film transistor array substrate of FIG. 1.

According to the second embodiment of the present disclosure, at least one of the light shielding layer 200, the gate electrode 330, the source electrode 340 or the drain electrode 350 includes the first quantum-dot layers 210, 331, 341 and 351 without their respective metal layers. For example, the light shielding layer 200, the gate electrode 330, the source electrode 340, and the drain electrode 350 may respectively include the first quantum-dot layers 210, 331, 341 and 351 without their respective metal layers. Alternatively, the gate electrode 330, the source electrode 340 and the drain electrode 350 may respectively include a metal layer and first quantum-dot layers 331, 341 and 351, and the light shielding layer 200 may include the first quantum-dot layer 210 without a metal layer. In addition, the gate electrode 330, the source electrode 340 and the drain electrode 350 include a metal layer without a quantum-dot layer, and the light shielding layer 200 may include the first quantum-dot layer 210 without the metal layer.

The first quantum-dot layers 210, 331, 341 and 351 may include a plurality of quantum-dots. In the second embodiment of the present disclosure, the first quantum-dot layers 210, 331, 341 and 351 may convert light incident from the outside into light of an infrared spectrum. In detail, the first quantum-dot layer 210, 331, 341 and 351 is capable of absorbing light having a wavelength range of 10 nm to 380 nm and light having a wavelength of 380 nm to 780 nm from the light incident from the outside. For example, the first quantum-dot layer 210, 331, 341 and 351 may absorb light of an ultraviolet spectrum, which has a wavelength range of 10 nm to 380 nm, and light of a visible light area, which has a wavelength range of 380 nm to 780 nm, from externally incident light. The first quantum-dot layer 210 may emit light having a wavelength range of 780 nm to 1000 nm. For example, the first quantum-dot layer 210 may emit light of an infrared spectrum, which has a wavelength range of 780 nm to 1000 nm. Therefore, the light of the wavelength range, which affects reflectance of the display apparatus, may be absorbed to attenuate reflectance of the display apparatus, whereby visibility of a panel may be improved.

In addition, the plurality of quantum-dots constituting the first quantum-dot layers 210, 331, 341 and 351 may have conductivity. Therefore, even though the metal layers 220, 233, 343 and 353 are omitted in the second embodiment in comparison with the first embodiment, the first quantum-dot layers 210, 331, 341 and 351 may serve as lines of the driving thin film transistor Tr. Thus, the first quantum-dot layers 210, 331, 341 and 351 are conductive quantum-dot layers.

A contact hole H passing through the buffer layer 250 and the interlayer insulating layer 400 may be formed to expose the light shielding layer 200. The source electrode 340 of the driving thin film transistor Tr may be extended in a direction in which the contact hole H is formed, and may be electrically connected to the light shielding layer 200 through the contact hole H. A lower surface of the contact hole H exposes the light shielding layer 200, and an inner surface of the contact hole H is comprised of sides of the buffer layer 250 and the interlayer insulating layer 400.

Therefore, since both the light shielding layer 200 and the source electrode 340 include a conductive material, the light shielding layer 200 is electrically connected to the source electrode 340, whereby the light shielding layer 200 may be prevented from disturbing the normal operation of the semiconductor layer 310 of the driving thin film transistor Tr.

Therefore, the second embodiment of the present disclosure discloses a structure in which the light shielding layer 200, the gate electrode 330, the source electrode 340 and the drain electrode 350 are comprised of conductive first quantum-dot layers 210, 331, 341 and 351, respectively, which include quantum-dots having conductivity. Therefore, even though a metal material is not additionally used in comparison with the first embodiment, the first quantum-dot layers 210, 331, 341 and 351 may serve as lines of the driving thin film transistor Tr. Also, the light incident from the outside that is visible to humans may be converted into the light of the infrared spectrum which is not visible to humans to absorb the light of the wavelength range that is visible to humans. Thus, reflectance of the display apparatus may be attenuated to improve visibility of the panel.

Figure 3:
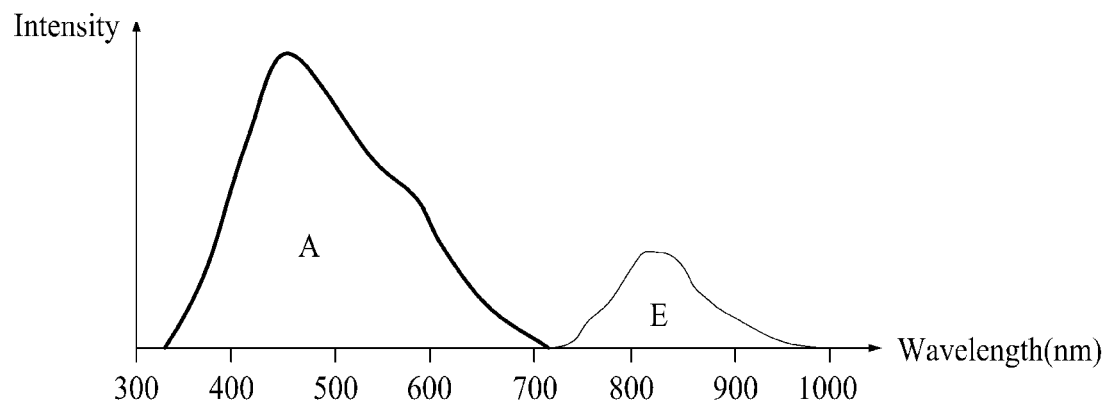
FIG. 3 is a graph illustrating a spectrum of a first quantum-dot layer according to the first and second embodiments of the present disclosure.

FIG. 3 is a graph illustrating spectrums of first quantum-dot layers 210, 331, 341 and 351 according to the first and second embodiments of the present disclosure.

Referring to FIG. 3, the first quantum-dot layers 210, 331, 341 and 351 may absorb light of a wavelength range of an area A in the graph and emit light of a wavelength range of an area E in the graph.

In detail, in the graph, the area A may include a wavelength range of 10 nm to 380 nm, that is, an ultraviolet area, and a wavelength range of 380 nm to 780 nm, that is, a visible light area. In the graph, the area E may include a wavelength range of 780 nm to 1000 nm, that is, light in an infrared spectrum that is not visible. Therefore, the first quantum-dot layers 210, 331, 341 and 351 according to the first and second embodiments may convert the light incident from the outside into the light of the infrared spectrum.

Third Embodiment

Figure 4:
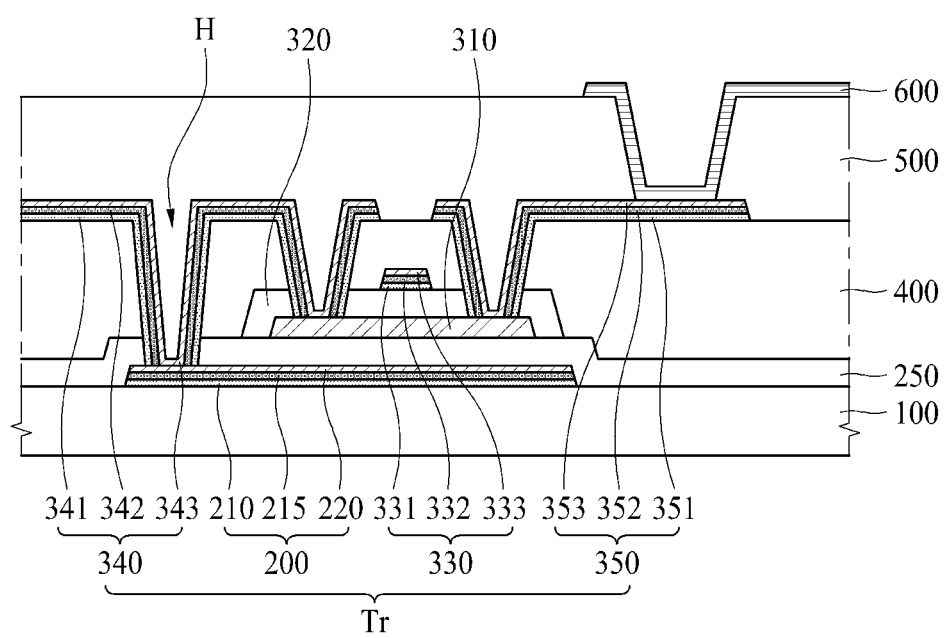
FIG. 4 is a cross-sectional view illustrating a thin film transistor array substrate according to a third embodiment of the present disclosure.

FIG. 4 is a cross-sectional view illustrating a thin film transistor array substrate according to a third embodiment of the present disclosure.

The thin film transistor array substrate according to FIG. 4 is modified from the thin film transistor array substrate of FIG. 1 in the light shielding layer 200, the gate electrode 330, the source electrode 340, and the drain electrode 350. Hereinafter, the following description will be based on differences from the thin film transistor array substrate of FIG. 1.

At least one of the light shielding layer 200, the gate electrode 330, the source electrode 340 and the drain electrode 350 may include second quantum-dot layers 215, 332, 342, 352 in addition to the first quantum-dot layers and metal layers previously described above. For example, the light shielding layer 200, the gate electrode 330, the source electrode 340 and the drain electrode 350 may respectively include metal layers 220, 333, 343 and 353, first quantum-dot layers 210, 331, 341 and 351, and second quantum-dot layers 215, 332, 342 and 352. Alternatively, the gate electrode 330, the source electrode 340 and the drain electrode 350 may respectively include metal layers 333, 343 and 353 and first quantum-dot layers 331, 341 and 351 without the second quantum-dot layers, and the light shielding layer 200 may include a metal layer 220, a first quantum-dot layer 210 and a second quantum-dot layer 215. In addition, the gate electrode 330, the source electrode 340 and the drain electrode 350 may respectively include metal layers 333, 343 and 353 without the first and second quantum-dot layers, and the light shielding layer 200 may include a metal layer 220, a first quantum-dot layer 210 and a second quantum-dot layer 215. Alternatively, the light shielding layer 200, the source electrode 340 and the drain electrode 350 may respectively include a metal layer 220, 343 and 353, a first quantum-dot layer 210, 341 and 351, and a second quantum-dot layer 215, 342 and 352, and the gate electrode 330 may include a metal layer 333 and a first quantum-dot layer 331 without the second quantum-dot layer.

Figure 5:
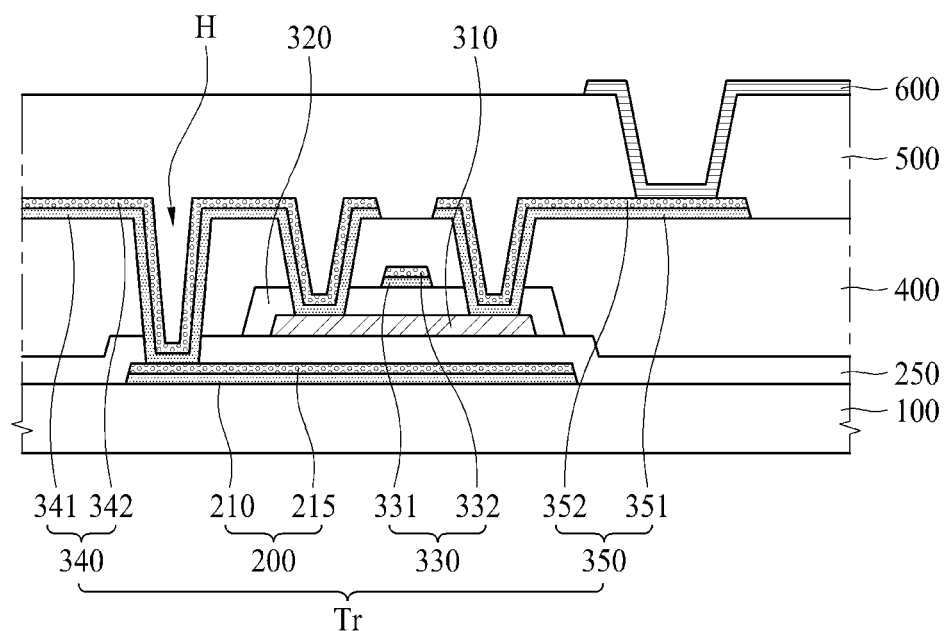
FIG. 5 is a cross-sectional view illustrating a thin film transistor array substrate according to a fourth embodiment of the present disclosure.

In FIG. 5, each of the light shielding layer 200, the gate electrode 330, the source electrode 340 and the drain electrode 350 include metal layers 220, 333, 343 and 353, first quantum-dot layers 210, 331, 341 and 351 and second quantum-dot layer 215, 332, 342 and 352, respectively.

The second quantum-dot layers 215, 332, 342 and 352 are respectively provided between the first quantum-dot layers 210, 331, 341 and 351 and the metal layers 220, 333, 343 and 353.

As described above, the first quantum-dot layers 210, 331, 341 and 351 may convert light incident from the outside into light of an infrared spectrum. In detail, the first quantum-dot layers 210, 331, 341 and 351 may absorb light having a wavelength range of 10 nm to 380 nm and light having a wavelength range of 380 nm to 780 nm from the light incident from the outside. For example, the first quantum-dot layers 210, 331, 341 and 351 may absorb light of the ultraviolet spectrum and light of the visible light spectrum. The first quantum-dot layers 210, 331, 341 and 351 may emit light having a wavelength range of 780 nm to 1000 nm. For example, the first quantum-dot layers 210, 331, 341 and 351 may emit the light of the infrared spectrum.

The second quantum-dot layers 215, 332, 342 and 352 may convert light incident from the outside into light of a visible light spectrum. In detail, the second quantum-dot layers 215, 332, 342 and 352 may absorb light having a wavelength range of 10 nm to 380 nm from the light incident from the outside. For example, the second quantum-dot layers 215, 332, 342 and 352 may absorb light of an ultraviolet area having a wavelength range of 10 nm to 380 nm. The second quantum-dot layers 215, 332, 342 and 352 may emit light having a wavelength range of 380 nm to 780 nm. For example, the second quantum-dot layers 215, 332, 342 and 352 may emit light of a visible light area having a wavelength range of 380 nm to 780 nm. In order to improve a color of a panel, the second quantum-dot layers 215, 332, 342 and 352 may emit light of one of a wavelength range of red (R) light, a wavelength range of green (G) light and a wavelength range of blue (B) light. This will be described in detail with reference to FIGS. 6A to 8C.

Also, a wavelength range of the light emitted from the second quantum-dot layer 215 of the light shielding layer 200 and a wavelength range of the light emitted from the second quantum-dot layer 332, 342 and 352 of the gate electrode 330, the source electrode 340 and the drain electrode 350 may be the same as or different from each other.

A contact hole H passing through the buffer layer 250, the first quantum-dot layer 341 of the source electrode 340, the second quantum-dot layer 342 and the interlayer insulating layer 400 may be formed to expose the light shielding layer 200. The source electrode 340 of the driving thin film transistor Tr may be extended in a direction in which the contact hole H is formed, so that the metal layer 343 of the source electrode 340 may be electrically connected to the light shielding layer 200 through the contact hole H. A lower surface of the contact hole H exposes the metal layer 220 of the light shielding layer 200, and an inner surface of the contact hole H is comprised of the second quantum-dot layer 342 of the source electrode 340.

Therefore, referring to FIG. 4, the third embodiment discloses a structure in which the light shielding layer 200, the gate electrode 330, the source electrode 340 and the drain electrode 350 include first quantum-dot layers 210, 331, 341 and 351, second quantum-dot layers 215, 332, 342 and 352 and metal layers 220, 333, 343 and 353, respectively. Therefore, the light of the wavelength range, which affects reflectance of the display apparatus, may be absorbed to attenuate reflectance of the display apparatus and emit light of a visible light wavelength range, whereby a color of a panel may be improved.

Fourth Embodiment

FIG. 5 is a cross-sectional view illustrating a thin film transistor array substrate according to a fourth embodiment of the present disclosure.

The thin film transistor array substrate according to FIG. 5 has a structure modified from that of the thin film transistor array substrate according to FIG. 2 in the light shielding layer 200, the gate electrode 330, the source electrode 340 and the drain electrode 350. Hereinafter, the following description will be based on differences from the thin film transistor array substrate of FIG. 2.

At least one of the light shielding layer 200, the gate electrode 330, the source electrode 340 and the drain electrode 350 may include the first quantum-dot layers 210, 331, 341 and 351 and the second quantum-dot layers 215, 332, 342 and 352 without metal layers. For example, the light shielding layer 200, the gate electrode 330, the source electrode 340 and the drain electrode 350 may respectively include the first quantum-dot layers 210, 331, 341 and 351 and the second quantum-dot layers 215, 332, 342 and 352 without metal layers. Alternatively, the gate electrode 330, the source electrode 340 and the drain electrode 350 may respectively include a metal layer, first quantum-dot layers 331, 341 and 351 and second quantum-dot layers 332, 342 and 352, and the light shielding layer 200 may include the first quantum-dot layer 210 and the second quantum-dot layer 215 without a metal layer. In addition, the gate electrode 330, the source electrode 340 and the drain electrode 350 may respectively include a metal layer and first quantum-dot layers 331, 341 and 351 without the second quantum-dot layers, and the light shielding layer 200 may include the first quantum-dot layer 210 and the second quantum-dot layer 215 without the metal layer. Alternatively, the gate electrode 330, the source electrode 340 and the drain electrode 350 may include a metal layer without the first and second quantum-dot layers, and the light shielding layer 200 may include the first quantum-dot layer 210 and the second quantum-dot layer 215 without the metal layer.

The second quantum-dot layers 215, 332, 342 and 352 are provided on the first quantum-dot layers 210, 331, 341 and 351.

As described above, the first quantum-dot layers 210, 331, 341 and 351 may convert light incident from the outside into light of an infrared spectrum. In detail, the first quantum-dot layers 210, 331, 341 and 351 are capable of absorbing light of a wavelength range of 10 nm to 380 nm, that is, light of an ultraviolet spectrum, and light of a wavelength range of 380 nm to 780 nm, that is, light of a visible light spectrum, from the light incident from the outside. The first quantum-dot layers 210, 331, 341 and 351 may emit light of a wavelength range of 780 nm to 1000 nm, that is, light of an infrared spectrum.

The second quantum-dot layers 215, 332, 342 and 352 may convert light incident from the outside into light of a visible light spectrum. In detail, the second quantum-dot layers 215, 332, 342 and 352 may absorb light having a wavelength range of 10 nm to 380 nm from the light incident from the outside. For example, the second quantum-dot layers 215, 332, 342 and 352 may absorb light of the ultraviolet spectrum, which has a wavelength range of 10 nm to 380 nm. The second quantum-dot layers 215, 332, 342 and 352 may emit light having a wavelength range of 380 nm to 780 nm. For example, the second quantum-dot layers 215, 332, 342 and 352 may emit light of a visible light spectrum, which has a wavelength range of 380 nm to 780 nm. In order to improve a color of a panel, the second quantum-dot layers 215, 332, 342 and 352 may emit light of one of a wavelength range of red (R) light, a wavelength range of green (G) light and a wavelength range of blue (B) light. This will be described in detail with reference to FIGS. 6A to 8C.

Also, a wavelength range of the light emitted from the second quantum-dot layer 215 of the light shielding layer 200 and a wavelength range of the light emitted from the second quantum-dot layer 332, 342 and 352 of the gate electrode 330, the source electrode 340 and the drain electrode 350 may be the same as or different from each other.

In addition, the plurality of quantum-dots constituting the first quantum-dot layers 210, 331, 341 and 351 and the second quantum-dot layers 215, 332, 342 and 352 may have conductivity. Thus, the first quantum-dot layers 210, 331, 341 and 351 and the second quantum-dot layers 215, 332, 342 and 352 are conductive quantum-dot layers. Therefore, even though the metal layers 220, 233, 343 and 353 are omitted in the fourth embodiment in comparison with the third embodiment, the first quantum-dot layers 210, 331, 341 and 351 and the second quantum-dot layers 215, 332, 342 and 352 may serve as lines of the driving thin film transistor Tr.

A contact hole H passing through the buffer layer 250 and the interlayer insulating layer 400 may be formed to expose the light shielding layer 200. The source electrode 340 of the driving thin film transistor Tr may be extended in a direction in which the contact hole H is formed, so that the first quantum-dot layer 341 of the source electrode 340 may be electrically connected to the light shielding layer 200 through the contact hole H. A lower surface of the contact hole H exposes the second quantum-dot layer 215 of the light shielding layer 200, and an inner surface of the contact hole H is comprised of sides of the buffer layer 250 and the interlayer insulating layer 400.

Therefore, since both the light shielding layer 200 and the source electrode 340 include a conductive material, the light shielding layer 200 is electrically connected to the source electrode 340, whereby the light shielding layer 200 may be prevented from disturbing the normal operation of the semiconductor layer 310 of the driving thin film transistor Tr.

Therefore, referring to FIG. 5, the fourth embodiment discloses a structure in which the light shielding layer 200, the gate electrode 330, the source electrode 340 and the drain electrode 350 are comprised of first quantum-dot layers 210, 331, 341 and 351 and second quantum-dot layers 215, 332, 342 and 352, respectively, which include quantum-dots having conductivity. Therefore, even though a metal material is not additionally used, the first quantum-dot layers 210, 331, 341 and 351 may serve as lines of the driving thin film transistor Tr. Also, the light of the wavelength range, which affects reflectance of the display apparatus, may be absorbed to attenuate reflectance of the display apparatus and emit light of a visible light wavelength range, whereby a color of a panel may be improved.

Figure 6A:
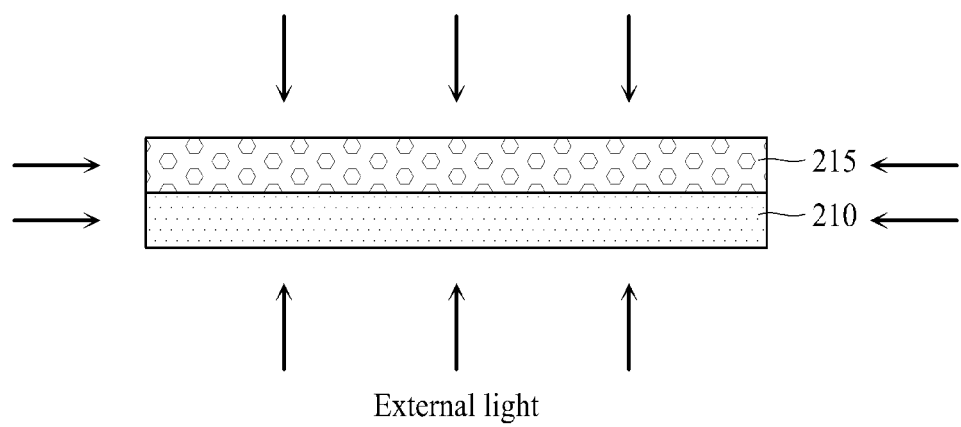
FIGS. 6A to 6C are graphs illustrating structures of first and second quantum-dot layers and their spectrums according to the third and fourth embodiments of the present disclosure.
Figure 6B:
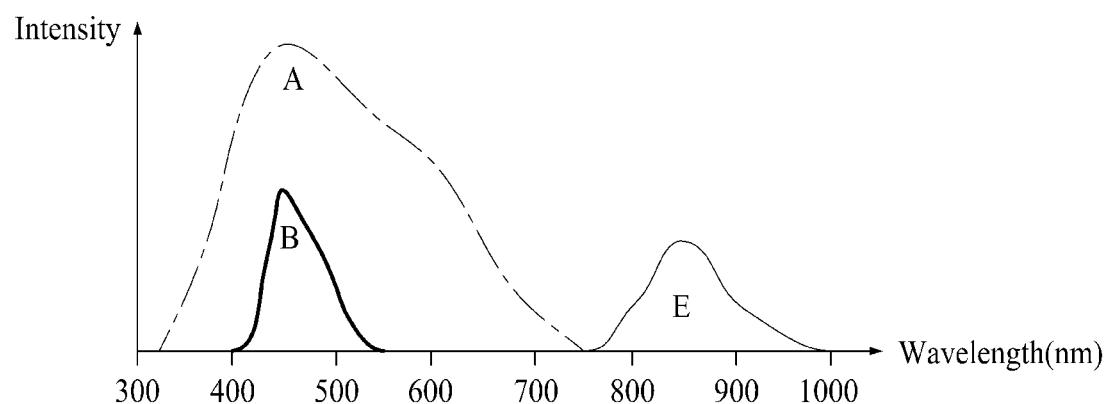
Figure 6C:
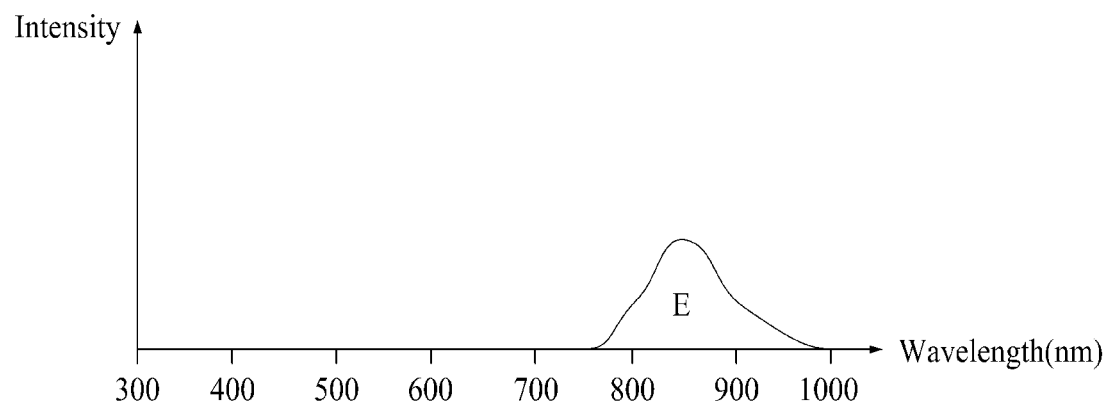

FIGS. 6A to 6C are graphs illustrating structures of first and second quantum-dot layers 210 and 215 and their spectrums according to the third and fourth embodiments of the present disclosure.

In FIG. 6A, the first and second quantum-dot layers 210 and 215 of the light shielding layer 200 are described as an example, but the same structure and spectrum characteristics may be disclosed in at least one of the gate electrode 330, the source electrode 340 or the drain electrode 350.

Referring to FIG. 6A, the second quantum-dot layer 215 is provided on the first quantum-dot layer 210. An area of the upper surface of the first quantum-dot layer 210 and an area of the lower surface of the second quantum-dot layer 215 may be the same as each other. Therefore, sides of the first and second quantum-dot layers 210 and 215, the entire lower surface of the first quantum-dot layer 210 and the entire upper surface of the second quantum-dot layer 215 may be exposed to the outside.

Referring to FIG. 6B, the first quantum-dot layer 210 may absorb light of an area A and emit light of an area E. The second quantum-dot layer 215 may emit light of an area B.

In detail, the area A may include an ultraviolet spectrum having a wavelength range of 10 nm to 380 nm, and a visible light spectrum having a wavelength range of 380 nm to 780 nm. The area E may include light of an infrared spectrum, which has a wavelength range of 780 nm to 1000 nm. The area B may include blue (B) light having a wavelength range of 400 nm to 550 nm.

When external light is incident on the first quantum-dot layer 210, the first quantum-dot layer 210 may absorb the light of the area A from the external light and emit light of the area E. Since the second quantum-dot layer 215 does not absorb light of the area E, the light of the area E, which is emitted from the first quantum-dot layer 210, may be emitted to a lower portion of the display apparatus.

When external light is incident on the second quantum-dot layer 215, the second quantum-dot layer 215 may emit light of the area B. In this case, since the area A, which is a wavelength range of the light absorbed by the first quantum-dot layer 210, includes the area B, most of the light of the area B, which is emitted from the second quantum-dot layer 215, may be absorbed into the first quantum-dot layer 210.

In detail, the light of the area B, which is emitted from the second quantum-dot layer 215, may be emitted to the upper surface, the lower surface and the sides of the second quantum-dot layer 215. At this time, from the light of the area B, which is emitted from the second quantum-dot layer 215, the light incident on the first quantum-dot layer 210 may be absorbed into the first quantum-dot layer 210. Also, from the light of the area B, which is emitted from the second quantum-dot layer 215, the light that is not incident on the first quantum-dot layer 210 may be reflected by lines inside the display apparatus and absorbed into the first quantum-dot layer 210. Alternatively, when at least one of the gate electrode 330, the source electrode 340 or the drain electrode 350 includes the first quantum-dot layers 331, 341 and 351, from the light of the area B, which is emitted from the second quantum-dot layer 215, the light that is not incident on the first quantum-dot layer 210 may be reflected by the lines inside the display apparatus and absorbed into the first quantum-dot layer 331, 341 or 351 of at least one of the gate electrode 330, the source electrode 340 or the drain electrode 350. Therefore, most of the light of the area B, which is emitted from the second quantum-dot layer 215, is absorbed into the display apparatus, so that the light may not be emitted to the lower portion of the display apparatus.

Therefore, as shown in FIG. 6*c*, the light of the area E may be finally emitted in a lower direction of the display apparatus. Since the light of the area E is light of an infrared area, which has a wavelength range of 780 nm to 1000 nm, the thin film transistor array substrate according to FIGS. 6A to 6C may convert light incident from the outside into light of an infrared spectrum. Therefore, in the present disclosure, the light of the wavelength range, which affects reflectance of the display apparatus, may be absorbed to attenuate reflectance of the display apparatus.

Also, in FIGS. 6A to 6C, the second quantum-dot layer 215 emits blue (B) light, but may emit red (R) or green (G) light.

However, as described above, in case of FIGS. 6A to 6C, since most of the light of the visible light spectrum, which is emitted from the second quantum-dot layer 215, is absorbed into the first quantum-dot layer 210, a problem occurs in that the light of the visible light spectrum, which is emitted from the second quantum-dot layer 215, cannot be utilized. Therefore, as shown in FIGS. 7A to 7C and 8A to 8C, the structure of the first and second quantum-dot layers 210 and 215 may be changed.

Figure 7A:
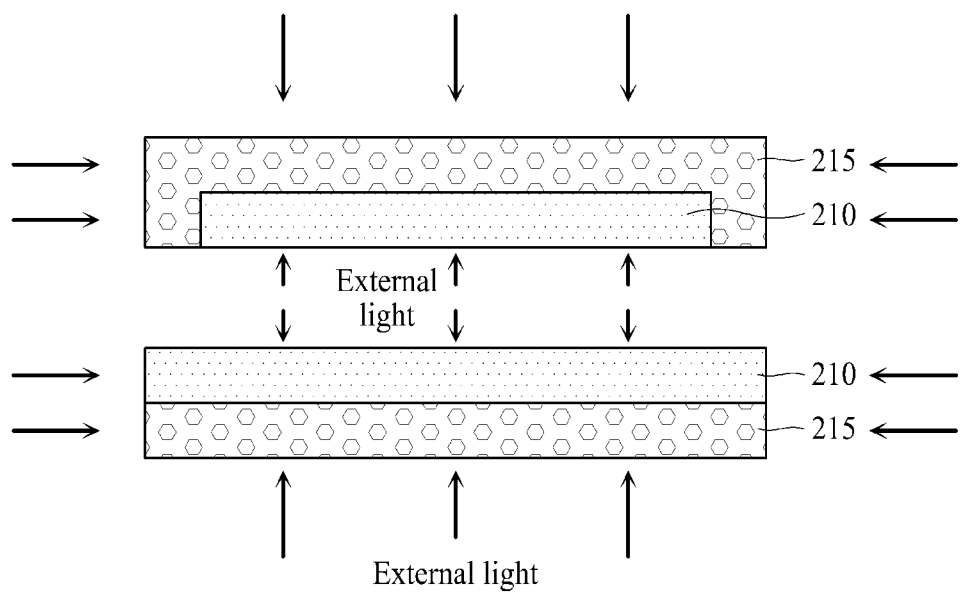
FIGS. 7A to 7C are graphs illustrating other structures of first and second quantum-dot layers and their spectrums according to the third and fourth embodiments of the present disclosure.
Figure 7B:
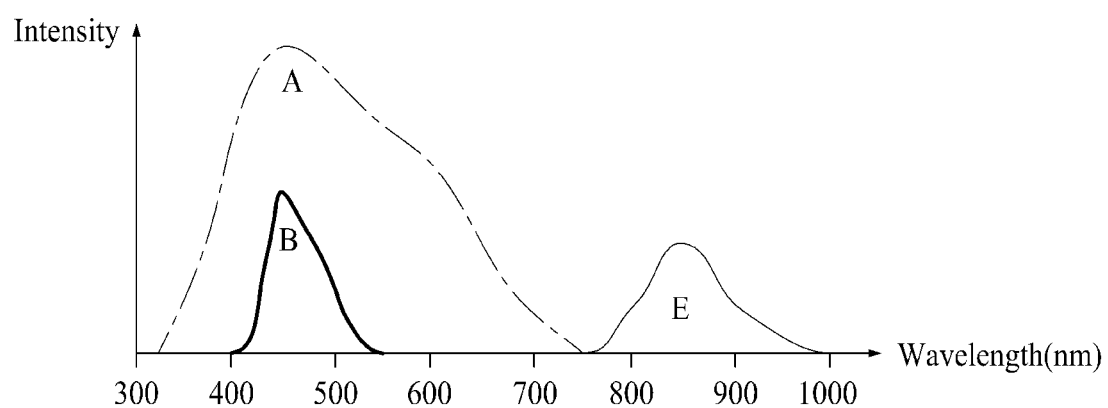
Figure 7C:
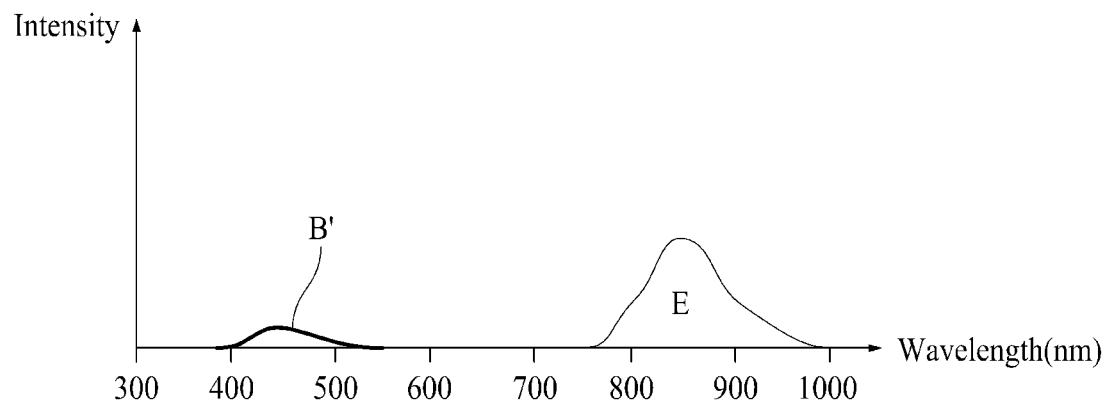

FIGS. 7A to 7C are graphs illustrating other structures of first and second quantum-dot layers 210 and 215 and their spectrums according to the third and fourth embodiments of the present disclosure.

In FIG. 7A, the first and second quantum-dot layers 210 and 215 of the light shielding layer 200 are described as an example, but the same structure and spectrum characteristics may be disclosed in at least one of the gate electrode 330, the source electrode 340 or the drain electrode 350.

Referring to an upper side of FIG. 7A, the second quantum-dot layer 215 is provided on the first quantum-dot layer 210. The second quantum-dot layer 215 may be formed to cover both the upper surface and the sides of the first quantum-dot layer 210. Therefore, the entire lower surface of the first quantum-dot layer 210 and the entire upper surface, sides and a portion of the lower surface of the second quantum-dot layer 215 may be exposed to the outside. The entire upper surface and sides of the first quantum-dot layer 210 may be in contact with the second quantum-dot layer 215.

Alternatively, referring to a lower side of FIG. 7A, the second quantum-dot layer 215 is provided below the first quantum-dot layer 210. An area of the lower surface of the first quantum-dot layer 210 and an area of the upper surface of the second quantum-dot layer 215 may be the same as each other. Therefore, the entire upper surface and sides of the first quantum-dot layer 210 and the entire lower surface and sides of the second quantum-dot layer 215 may be exposed to the outside.

Referring to FIG. 7B, the first quantum-dot layer 210 may absorb light of an area A and emit light of an area E. The second quantum-dot layer 215 may emit light of an area B.

In detail, the area A may include an ultraviolet spectrum having a wavelength range of 10 nm to 380 nm, and a visible light area having a wavelength range of 380 nm to 780 nm. The area E may include light of an infrared spectrum, which has a wavelength range of 780 nm to 1000 nm. The area B may include blue (B) light having a wavelength range of 400 nm to 550 nm.

When external light is incident on the first quantum-dot layer 210, the first quantum-dot layer 210 may absorb the light of the area A from the external light and emit light of the area E. Since the second quantum-dot layer 215 does not absorb light of the area E, the light of the area E, which is emitted from the first quantum-dot layer 210, may be emitted to a lower portion of the display apparatus.

When external light is incident on the second quantum-dot layer 215, the second quantum-dot layer 215 may emit light of the area B. In this case, since the area A, which is a wavelength range of the light absorbed by the first quantum-dot layer 210, includes the area B, a portion of the light of the area B, which is emitted from the second quantum-dot layer 215, may be absorbed into the first quantum-dot layer 210, and the other portion of the light of the area B may be emitted to the lower portion of the display apparatus.

In detail, the light of the area B, which is emitted from the second quantum-dot layer 215, may be emitted to the upper surface, the lower surface and the sides of the second quantum-dot layer 215. At this time, from the light of the area B, which is emitted from the second quantum-dot layer 215, the light incident on the first quantum-dot layer 210 may be absorbed into the first quantum-dot layer 210. Also, from the light of the area B, which is emitted from the second quantum-dot layer 215, the light that is not incident on the first quantum-dot layer 210 may be reflected by lines inside the display apparatus and absorbed into the first quantum-dot layer 210. Alternatively, when at least one of the gate electrode 330, the source electrode 340 or the drain electrode 350 includes the first quantum-dot layer 331, 341 or 351, from the light of the area B, which is emitted from the second quantum-dot layer 215, the light that is not incident on the first quantum-dot layer 210 may be reflected by the lines inside the display apparatus and absorbed into the first quantum-dot layer 331, 341 or 351 of at least one of the gate electrode 330, the source electrode 340 or the drain electrode 350.

However, as shown in the upper side of FIG. 7A, a portion of the lower surface of the second quantum-dot layer 215 may be exposed to the outside without being in contact with the first quantum-dot layer 210. Therefore, a portion of the light of the area B, which is emitted from the second quantum-dot layer 215, is not incident on the first quantum-dot layer 210, and may be directly emitted from the portion of the lower surface of the second quantum-dot layer 215 toward the lower direction of the display apparatus. Also, as shown in the lower side of FIG. 7A, the entire lower surface of the second quantum-dot layer 215 may be exposed to the outside without being in contact with the first quantum-dot layer 210. Therefore, a portion of the light of the area B, which is emitted from the second quantum-dot layer 215, is not incident on the first quantum-dot layer 210, and may be directly emitted from the entire lower surface of the second quantum-dot layer 215 toward the lower direction of the display apparatus.

Therefore, in the structure of FIGS. 6A to 6C, most of the light of the area B, which is emitted from the second quantum-dot layer 215, is absorbed into the first quantum-dot layer 210. However, in the structure of FIGS. 7A to 7C, a portion of the light of the area B, which is emitted from the second quantum-dot layer 215, may be emitted in the lower direction of the display apparatus. Therefore, as shown in FIG. 7C, light of an area B' and light of the area E may be emitted in the lower direction of the display apparatus.

Since light of the area E is light of an infrared spectrum, which has a wavelength range of 780 nm to 1000 nm, the thin film transistor array substrate according to FIGS. 7A to 7C may convert light incident from the outside into light of an infrared spectrum. Therefore, in the present disclosure, the light of the wavelength range, which affects reflectance of the display apparatus, may be absorbed to attenuate reflectance of the display apparatus.

Also, the light of the area B' may be blue (B) light having a wavelength range of 400 nm to 550 nm. Since the light of the area B' is the light of the area B, which is not absorbed into the first quantum-dot layer 210, light intensity of the area B' may be less than that of the area B. The display apparatus of the present disclosure is a bottom emission type, and the light of the area B' may be emitted in the lower direction of the display apparatus, so that the light of the area B' may be used for adjusting a reflective color of the display apparatus. Therefore, the thin film transistor array substrate according to FIGS. 7A to 7C may convert light incident from the outside into light of an infrared area to reduce reflectance, and may emit light of a visible light area, which has a specific wavelength range, to adjust a reflective color.

Also, an area of the lower surface of the second quantum-dot layer 215 exposed to the outside may be adjusted, so that light intensity of the area B' may be adjusted. For example, since the area of the lower surface of the second quantum-dot layer 215 shown in the lower side of FIG. 7A is larger than that of the lower surface of the second quantum-dot layer 215 shown in the upper side of FIG. 7A, light intensity of the area B' may be stronger in the structure shown in the lower side of FIG. 7A. Therefore, the area of the second quantum-dot layer 215 may be adjusted to easily set the reflective color of the display apparatus.

Also, a concentration of the plurality of quantum-dots constituting the second quantum-dot layer 215 may be adjusted, so that light intensity of the area B' may be adjusted. For example, as the concentration of the plurality of quantum-dots constituting the second quantum-dot layer 215 becomes higher, intensity of the light that is emitted may become stronger, whereby light intensity of the area B' may be increased. Therefore, the concentration of the plurality of quantum-dots constituting the second quantum-dot layer 215 may be adjusted to easily set the reflective color of the display apparatus.

Also, in FIGS. 7A through 7C, the second quantum-dot layer 215 emits blue (B) light, but may emit red (R) or green (G) light.

Figure 8A:
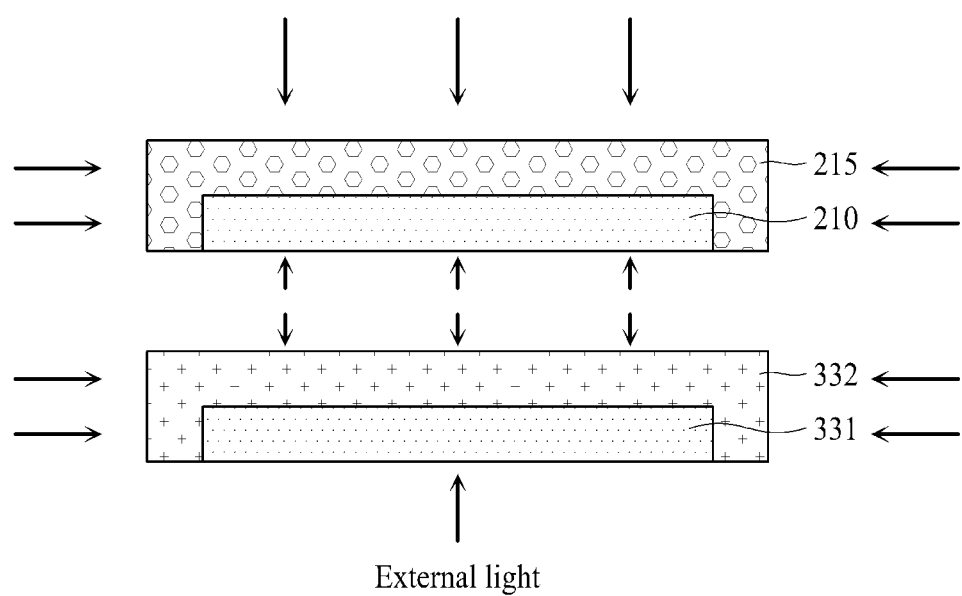
FIGS. 8A to 8C are graphs illustrating other structures of first and second quantum-dot layers and their spectrums according to the third and fourth embodiments of the present disclosure.
Figure 8B:
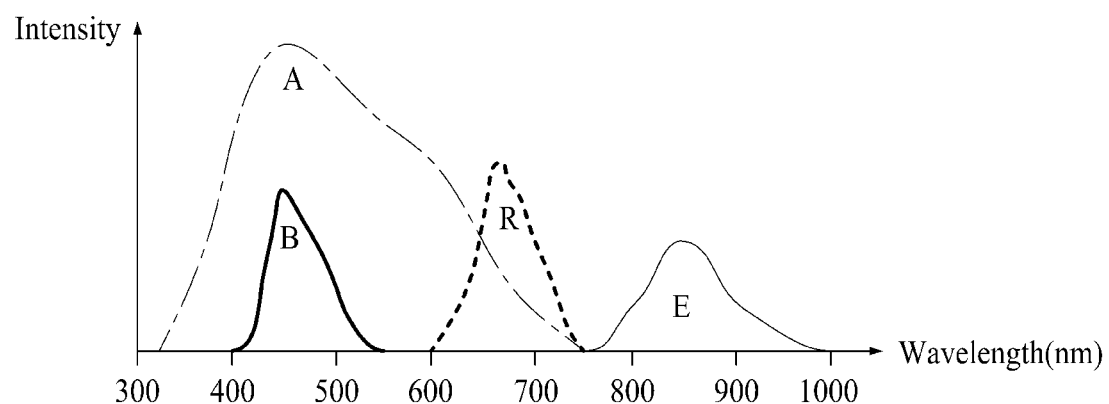
Figure 8C:
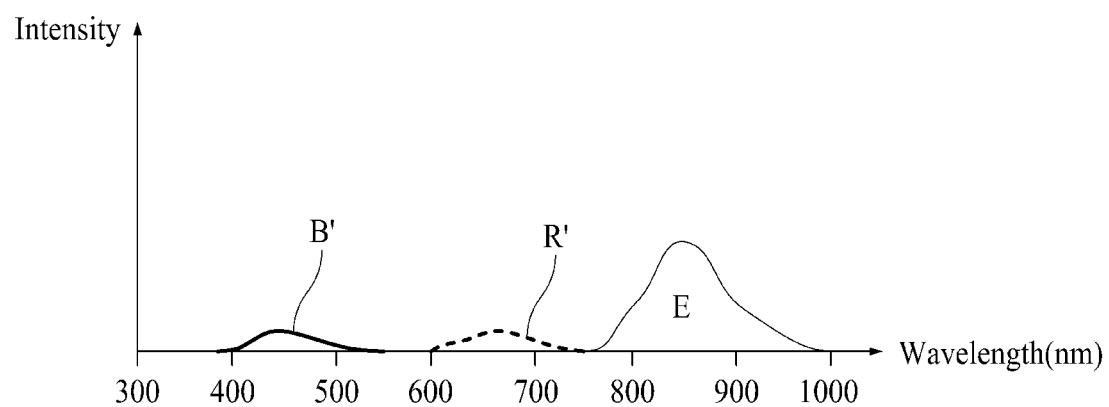

FIGS. 8A to 8C are graphs illustrating other structures of the first quantum-dot layers 210 and 331 and the second quantum-dot layers 215 and 332 and their spectrums according to the third and fourth embodiments of the present disclosure.

In FIG. 8A, the first and second quantum-dot layers 210 and 215 of the light shielding layer 200 and the first and second quantum-dot layers 331 and 332 of the gate electrode 330 are described as an example, but the same structure and spectrum characteristics may be disclosed in the source electrode 340 or the drain electrode 350.

Referring to FIG. 8A, in the light shielding layer 200, the second quantum-dot layer 215 is provided on the first quantum-dot layer 210. The second quantum-dot layer 215 may be formed to cover both the upper surface and the sides of the first quantum-dot layer 210. Therefore, the entire lower surface of the first quantum-dot layer 210 and the entire upper surface, sides and a portion of the lower surface of the second quantum-dot layer 215 may be exposed to the outside. The entire upper surface and sides of the first quantum-dot layer 210 may be in contact with the second quantum-dot layer 215.

Likewise, in the gate electrode 330, the second quantum-dot layer 332 is provided on the first quantum-dot layer 331. The second quantum-dot layer 332 may be formed to cover both the upper surface and the sides of the first quantum-dot layer 331. Therefore, the entire lower surface of the first quantum-dot layer 331 and the entire upper surface, sides and a portion of the lower surface of the second quantum-dot layer 331 may be exposed to the outside. The entire upper surface and sides of the first quantum-dot layer 331 may be in contact with the second quantum-dot layer 332.

Also, the first quantum-dot layers 210 of the light shielding layer 200 and the first quantum-dot layer 331 of the gate electrode 330 may include the same quantum-dots. On the other hand, the second quantum-dot layer 215 of the light shielding layer 200 and the second quantum-dot layer 332 of the gate electrode 330 may include different quantum-dots.

Referring to FIG. 8B, the first quantum-dot layers 210 and 331 of the light shielding layer 200 and the gate electrode 330 may absorb light of an area A and emit light of an area E. The second quantum-dot layer 215 of the light shielding layer 200 may emit light of an area B, and the second quantum-dot layer 332 of the gate electrode 330 may emit light of an area R.

In detail, the area A may include an ultraviolet spectrum having a wavelength range of 10 nm to 380 nm, and a visible light spectrum having a wavelength range of 380 nm to 780 nm. The area E may include light of an infrared area, which has a wavelength range of 780 nm to 1000 nm. The area B may include blue (B) light having a wavelength range of 400 nm to 550 nm. The area R may include red (R) light having a wavelength range of 600 nm to 780 nm.

When external light is incident on the first quantum-dot layers 210 and 331, the first quantum-dot layers 210 and 331 may absorb the light of the area A from the external light and emit light of the area E. Since the second quantum-dot layers 215 and 332 do not absorb light of the area E, the light of the area E, which is emitted from the first quantum-dot layers 210 and 331, may be emitted to a lower portion of the display apparatus.

As described in FIGS. 7A to 7C, when external light is incident on the second quantum-dot layer 215 of the light shielding layer 200, the second quantum-dot layer 215 of the light shielding layer 200 may emit light of the area B. In this case, since the area A, which is a wavelength range of the light absorbed by the first quantum-dot layers 210 and 331, includes the area B, a portion of the light of the area B, which is emitted from the second quantum-dot layer 215 of the light shielding layer 200, may be absorbed into the first quantum-dot layers 210 and 331, and the other portion of the light of the area B may be emitted to the lower portion of the display apparatus.

Likewise, when external light is incident on the second quantum-dot layer 332 of the gate electrode 330, the second quantum-dot layer 332 of the gate electrode 330 may emit light of the area R. In this case, since the area A, which is a wavelength range of the light absorbed by the first quantum-dot layers 210 and 331, includes the area R, a portion of the light of the area R, which is emitted from the second quantum-dot layer 332 of the gate electrode 330, may be absorbed into the first quantum-dot layers 210 and 331, and the other portion of the light of the area R may be emitted to the lower portion of the display apparatus.

Therefore, as shown in FIG. 8C, the light of the area B', light of an area R' and the light of the area E may be finally emitted. Since the light of the area E is light of an infrared spectrum, which has a wavelength range of 780 nm to 1000 nm, the thin film transistor array substrate according to FIGS. 8A to 8C may convert light incident from the outside into light of an infrared area. Therefore, in the present disclosure, the light of the wavelength range, which affects reflectance of the display apparatus, may be absorbed to attenuate reflectance of the display apparatus.

Also, the light of the area B' may be blue (B) light having a wavelength range of 400 nm to 550 nm. As described in FIGS. 7A and 7B, the light of the area B' may be used to adjust a reflective color of the display apparatus. Likewise, the area R' may be red (R) light having a wavelength range of 600 nm to 780 nm. Since the light of the area R' is the light of the area R, which is not absorbed into the first quantum-dot layers 210 and 331, light intensity of the area R' may be smaller than that of the area R. The display apparatus of the present disclosure is a bottom emission type, and the light of the area R' may be emitted in the lower direction of the display apparatus, so that the light of the area R' may be used for adjusting a reflective color of the display apparatus. Therefore, the thin film transistor array substrate according to FIGS. 8A to 8C may convert light incident from the outside into light of an infrared spectrum to reduce reflectance, and disclose the second quantum-dot layers 215 and 332 emitting light of a visible light area, which has different wavelength ranges, to adjust a reflective color of various wavelength ranges.

Also, as described in FIGS. 7A to 7C, the area of the lower surface of each of the second quantum-dot layers 214 and 332 exposed to the outside and the concentration of the plurality of quantum-dots constituting the second quantum-dot layers 215 and 332 may be adjusted, so that the reflective color of the display apparatus may be easily set.

Also, in FIGS. 8A to 8C, the second quantum-dot layer 215 of the light shielding layer 200 emits blue (B) light and the second quantum-dot layer 332 of the gate electrode 330 emits red (R) light, but the present disclosure is not limited thereto. For example, the second quantum-dot layer 215 of the light shielding layer 200 may emit red (R) light and the second quantum-dot layer 332 of the gate electrode 330 may emit green (G) light or blue (B) light. Alternatively, the second quantum-dot layer 215 of the light shielding layer 200 may emit green (G) light and the second quantum-dot layer 332 of the gate electrode 330 may emit red (R) light or blue (B) light.

According to the present disclosure, the following advantageous effects may be obtained.

According to the present disclosure, the light shielding layer, which includes the quantum-dot layer, and the thin film transistor are provided to attenuate reflectance due to the external light and improve a color.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor array substrate comprising:
   a substrate;
   a light shielding layer on the substrate; and
   a thin film transistor on the substrate, the thin film transistor overlapped by the light shielding layer, the thin film transistor including;
   a semiconductor layer on the light shielding layer;
   a gate insulating layer on the semiconductor layer;
   a gate electrode on the gate insulating layer;
   a source electrode connected to a first side of the semiconductor layer; and
   a drain electrode connected to a second side of the semiconductor layer that is opposite the first side,
   wherein at least one of the light shielding layer, the gate electrode, the source electrode and the drain electrode includes a first quantum-dot layer, and visible light incident on the first quantum-dot layer is converted to non-visible light by the first quantum-dot layer,
   wherein at least one of the light shielding layer, the gate electrode, the source electrode, and the drain electrode further includes a metal layer on the first quantum-dot layer,
   wherein at least one of the light shielding layer, the gate electrode, the source electrode, and the drain electrode further includes a second quantum-dot layer that is between the first quantum-dot layer and the metal layer.

2. The thin film transistor array substrate of claim 1, wherein each of the light shielding layer, the gate electrode, the source electrode and the drain electrode is conductive.

3. The thin film transistor array substrate of claim 2, wherein at least one of the light shielding layer, the gate electrode, the source electrode, and the drain electrode further includes a second quantum-dot layer on the first quantum-dot layer, the second quantum-dot layer being conductive.

4. The thin film transistor array substrate of claim 3, wherein the second quantum-dot layer covers an upper surface and side surfaces of the first quantum-dot layer in at least one of the light shielding layer, the gate electrode, the source electrode and the drain electrode.

5. The thin film transistor array substrate of claim 1, wherein the non-visible light emitted by the first quantum-dot layer is in an infrared spectrum of light.

6. The thin film transistor array substrate of claim 1, wherein the second quantum-dot layer covers an upper surface and side surfaces of the first quantum-dot layer in at least one of the light shielding layer, the gate electrode, the source electrode and the drain electrode.

7. The thin film transistor array substrate of claim 1, wherein the second quantum-dot layer of at least one of the light shielding layer, the gate electrode, the source electrode, and the drain electrode emits light of any one color of red, green, or blue.

8. The thin film transistor array substrate of claim 7, wherein each of the light shielding layer, the gate electrode, the source electrode, and the drain electrode includes a respective second quantum-dot layer that all emit light of a same color.

9. The thin film transistor array substrate of claim 7, wherein each of the light shielding layer, the gate electrode, the source electrode, and the drain electrode includes a respective second quantum-dot layer and the color of the light emitted from the second quantum-dot layer of the light shielding layer is different from the color of the light emitted from the second quantum-dot layer of the gate electrode.

10. A thin film transistor array substrate comprising:
a substrate;
a thin film transistor on the substrate; and
a light shielding layer that overlaps the substrate such that the light shielding layer is between the thin film transistor and the substrate,
wherein the thin film transistor comprises:
  a semiconductor layer on the light shielding layer;
  a gate insulating layer on the semiconductor layer;
  a gate electrode on the gate insulating layer;
  a source electrode connected to a first side of the semiconductor layer; and
  a drain electrode connected to a second side of the semiconductor layer that is opposite the first side,
wherein at least one of the light shielding layer, the gate electrode, the source electrode, and the drain electrode includes a first quantum-dot layer,
wherein at least one of the light shielding layer, the gate electrode, the source electrode, and the drain electrode includes a metal layer on the first quantum-dot layer.

11. The thin film transistor array substrate of claim 10, wherein the non-visible spectrum is an infrared spectrum.

12. The thin film transistor array substrate of claim 10, wherein each of the light shielding layer, the gate electrode, the source electrode, and the drain electrode includes a respective first quantum-dot layer that is conductive and lacks a metal layer that is different from the respective first quantum-dot layer.

13. The thin film transistor array substrate of claim 10, wherein at least one of the light shielding layer and the portion of the thin film transistor further incudes a second quantum-dot layer on the first quantum-dot layer, the second quantum-dot layer configured to convert a portion of incident light in a visible spectrum to reflected light of a predetermined color in the visible spectrum.

14. The thin film transistor array substrate of claim 13, wherein the second quantum-dot layer covers an upper surface and side surfaces of the first quantum-dot layer in at least one of the light shielding layer, the gate electrode, the source electrode and the drain electrode.

15. A thin film transistor array substrate comprising:
a substrate;
a thin film transistor on the substrate; and
a light shielding layer that overlaps the substrate such that the light shielding layer is between the thin film transistor and the substrate,
wherein the thin film transistor comprises:
  a semiconductor layer on the light shielding layer;
  a gate insulating layer on the semiconductor layer;
  a gate electrode on the gate insulating layer;
  a source electrode connected to a first side of the semiconductor layer; and
  a drain electrode connected to a second side of the semiconductor layer that is opposite the first side,
wherein at least one of the light shielding layer, the gate electrode, the source electrode, and the drain electrode includes a first quantum-dot layer configured to convert a portion of incident light of the visible spectrum to reflected light of the predetermined color in the visible spectrum.

16. The thin film transistor array substrate of claim 15, wherein at least one of the light shielding layer, the gate electrode, the source electrode, and the drain electrode includes a respective metal layer on the respective first quantum-dot layer.

17. The thin film transistor array substrate of claim 15, wherein each of the light shielding layer, the gate electrode, the source electrode, and the drain electrode includes a respective first quantum-dot layer that is conductive and lacks a metal layer that is different from the respective first quantum-dot layer.

18. The thin film transistor array substrate of claim 15, wherein at least one of the light shielding layer and the portion of the thin film transistor further incudes a second quantum-dot layer on the first quantum-dot layer, the second quantum-dot layer configured to convert a portion of incident light in a visible spectrum to reflected light of a non-visible spectrum.

19. The thin film transistor array substrate of claim 18, wherein the non-visible spectrum is an infrared spectrum.

20. The thin film transistor array substrate of claim 18, wherein the first quantum-dot layer covers an upper surface and side surfaces of the second quantum-dot layer in at least one of the light shielding layer, the gate electrode, the source electrode and the drain electrode.

* * * * *